US007583156B2

(12) United States Patent
Hung et al.

(10) Patent No.: US 7,583,156 B2
(45) Date of Patent: Sep. 1, 2009

(54) OSCILLATOR WITH MULTI-TAP INDUCTOR, CAPACITORS, AND NEGATIVE-GM STAGES

(75) Inventors: Chih-Ming Hung, McKinney, TX (US); Nathen Barton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 97 days.

(21) Appl. No.: 11/801,716

(22) Filed: May 10, 2007

(65) Prior Publication Data

US 2008/0278250 A1    Nov. 13, 2008

(51) Int. Cl.
*H03B 5/08*    (2006.01)
(52) U.S. Cl. ............. 331/167; 331/117 FE; 331/117 R; 331/177 V; 455/260
(58) Field of Classification Search ................. 331/167, 331/177 R, 117 FE, 177 V; 455/260
See application file for complete search history.

(56) References Cited

U.S. PATENT DOCUMENTS 6,911,870 B2 *   6/2005   Gierkink et al. ............... 331/46
7,236,758 B1 *   6/2007   Cheah et al. ............. 455/252.1

2005/0184820 A1   8/2005   Hung et al.

OTHER PUBLICATIONS

Kral, A., et al., "RF-CMOS Oscillators with Switched Tuning," IEEE 1998 Custom Integrated Circuits Conference, 1998, pp. 555-558, IEEE, Los Alamitos, CA.
Väänänen, P., et al., "A 3.6 GHz Double Cross-Coupled Multivibrator VCO with 1.6-Ghz Tuning," IEEE Transactions on Circuits and Systems—II: Analog and Digital Signal Processing, Aug. 2001, pp. 799-802, vol. 48, No. 8, IEEE, Los Alamitos, CA.
Yim, S.-M., et al., "Demonstration of a Switched Resonator Concept in a Dual-Band Monolithic CMOS LC-Tuned VCO," IEEE 2001 Custom Integrated Circuits Conference, 2001, pp. 205-208, IEEE, Los Alamitos, CA.

* cited by examiner

*Primary Examiner*—Arnold Kinkead
(74) *Attorney, Agent, or Firm*—Lawrence J. Bassuk; W. James Brady; Fredrick J Telecky, Jr.

(57) ABSTRACT

System and method for increasing the frequency tuning range of a RF/microwave LC oscillator. An electronic communications device includes a controller to regulate the operation of the electronic communications device, a modem coupled to the controller, a radio frequency unit coupled to the controller and to the modem, an oscillator coupled to the controller and to the radio frequency unit, and an amplifier coupled to the radio frequency unit. The oscillator produces a timing and reference signal for the radio frequency unit based on control information from the controller. The oscillator includes a multi-tap inductor that may controllably alter its effective inductance to change the timing and reference signal provided to the radio frequency unit.

9 Claims, 6 Drawing Sheets

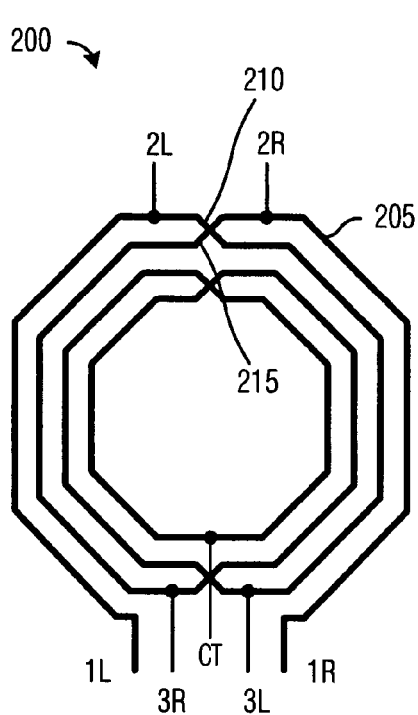
*Fig. 2a*
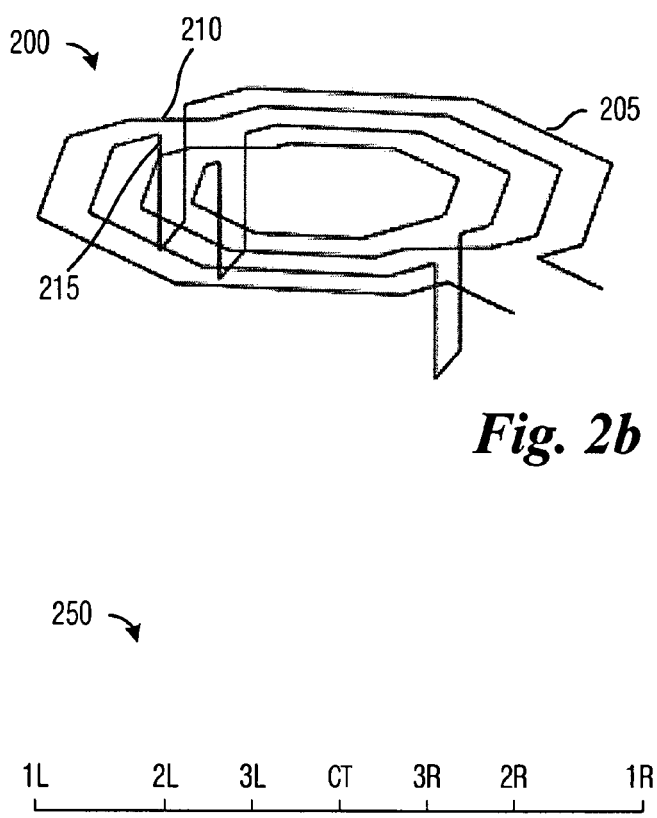
*Fig. 2b*
*Fig. 2c*
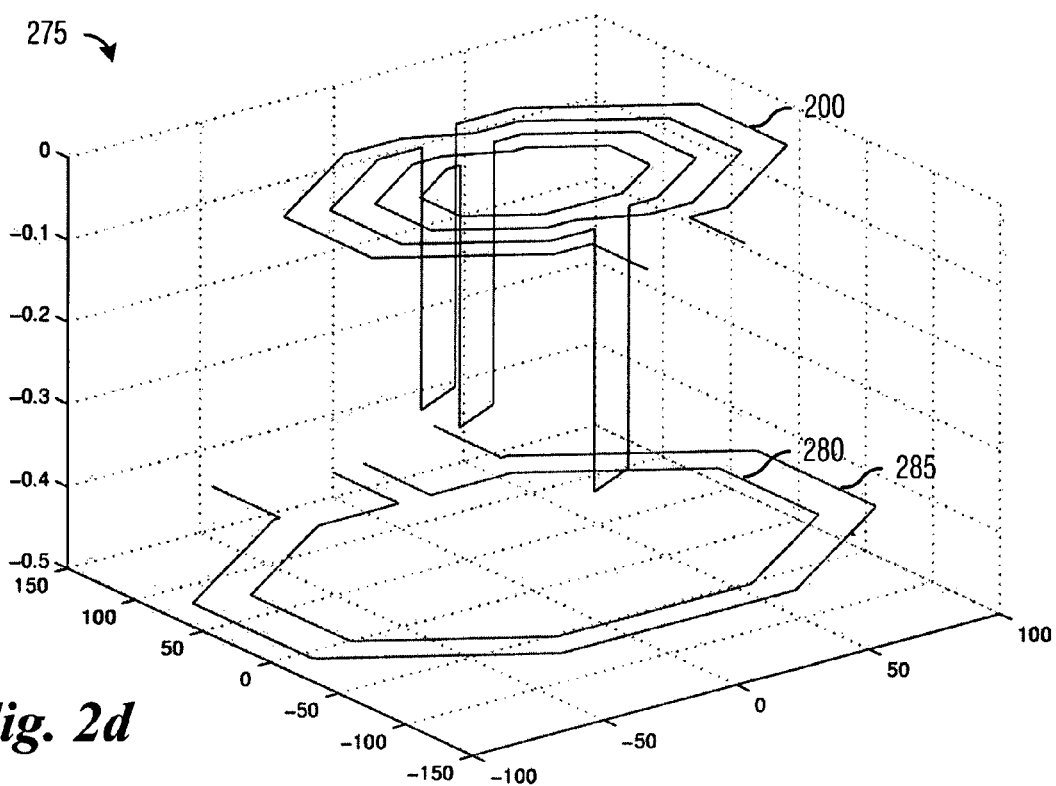
*Fig. 2d*

OSCILLATOR WITH MULTI-TAP INDUCTOR, CAPACITORS, AND NEGATIVE-GM STAGES

TECHNICAL FIELD

The present invention relates generally to a system and method for wireless communications, and more particularly to a system and method for increasing the frequency tuning range of a RF/microwave LC tank.

BACKGROUND

A desire of a cellular telephone user is to have a single cellular telephone that can operate anywhere in the world: a "world" phone. Unfortunately, in order to operate at different locations throughout the world, the world phone needs to be able to communicate with different cellular communications networks, each using a potentially different communications mechanism, as well as being able to tune its oscillator to different frequency ranges. This is due to the wide variety of communications standards and frequency bands being used in different areas of the world. For example, in the United States, it is common to encounter GSM (Global System for Mobile Communications), CDMA (Code Division Multiple Access), TDMA (Time-Division Multiple Access), digital cellular system (DCS), and personal communications service (PCS) cellular telephone networks. These multiple types of cellular telephone networks may use multiple frequency ranges, such as the 850 and 900 MHz frequency ranges as well as the 1.8 and 1.9 GHz frequency ranges on up to over 2.7 GHz. In other areas of the world, other types of cellular telephone networks and frequency ranges may be in use.

One solution to the problem of tuning an oscillator to such a wide variety of frequency ranges is to use multiple oscillators, with one oscillator for each frequency range of interest. With multiple oscillators, each oscillator may be optimized for each frequency range, potentially maximizing tuning accuracy.

Another solution to the problem is to use a single oscillator but with multiple oscillator cores or LC tanks. The multiple oscillator cores or LC tanks may be used to extend the tuning range of the single oscillator without needing multiple oscillators. Each of the multiple oscillator cores or LC tanks may be switched into use when needed. Again, the use of multiple oscillator cores or LC tanks may allow for the optimization of oscillator performance for the different frequency ranges in use.

Yet another solution to the problem is to use a switch (or switches), such as a CMOS switch, to short circuit a portion of an inductor to increase the tuning range of the local oscillator. The short circuiting of a portion of an inductor may alter the inductance of the inductor, thereby changing the tuning range of the oscillator. The use of the switch may permit the use of a single local oscillator.

SUMMARY OF THE INVENTION

These and other problems are generally solved or circumvented, and technical advantages are generally achieved, by embodiments of a system and a method for increasing the frequency tuning range of a RF/microwave LC tank.

In accordance with an embodiment, an oscillator with an extended frequency tuning range is provided. The oscillator includes a plurality of inductor-capacitor (LC) tanks. The plurality of LC tanks includes a multi-tap inductor having at least two pairs of taps and a center tap, a plurality of capacitors, and a plurality of negative-Gm stages. Each pair of taps of the multi-tap inductor is coupled to a conductor at specified positions on the conductor and the center tap is coupled to a first power rail. Furthermore, each capacitor having a first terminal coupled to a tap of the pairs of taps of the multi-tap inductor and each negative-Gm stage controllably coupled to a pair of taps of the multi-tap inductor.

In accordance with another embodiment, an electronic communications device is provided. The electronic communications device includes a controller, a modem coupled to the controller, a radio frequency unit coupled to the controller and to the modem, and an amplifier coupled to the radio frequency unit. The controller regulates the operation of the electronic communications device and performs computations, the modem modulates data to be transmitted by the electronic communications device, and the radio frequency unit converts a digital data stream into an analog signal and mixes the analog signal with a carrier signal. The oscillator produces a timing and frequency reference signal for the radio frequency unit based on control information provided by the controller and the amplifier increases a signal level of a mixed analog signal to a level for transmission by an antenna. The oscillator includes a multi-tap inductor having at least two pairs of taps and a center tap, a plurality of capacitors, and a plurality of negative-Gm stages. Each pair of taps of the multi-tap inductor is coupled to a conductor at specified positions on the conductor and the center tap is coupled to a first power rail. Furthermore, each capacitor has a first terminal coupled to a tap of the pairs of taps of the multi-tap inductor and each negative-Gm stage is controllably coupled to a pair of taps of the multi-tap inductor.

In accordance with another embodiment, a method for designing an oscillator for extended frequency tuning range is provided. The method includes determining inductor values need to provide tuning over the extended frequency tuning range, calculating a needed number of pairs of taps for a multi-tap inductor, simulating the performance of the oscillator with the multi-tap inductor, and comparing the performance of the simulated oscillator with performance expectations. The method also includes fabricating the oscillator with the multi-tap inductor if the simulated oscillator meets performance expectations.

An advantage of an embodiment is that the frequency tuning range of a RF/microwave LC oscillator is increased without the use of multiple oscillator cores and LC tanks. Since multiple oscillator cores and LC tanks are not used, the LC oscillator can be kept to a minimum size, thereby decreasing the silicon footprint of the LC oscillator.

A further advantage of an embodiment is that only an insignificant parasitic capacitance is added to the LC oscillator. Therefore, as the operating frequencies increase, there may not be a significant performance penalty. Furthermore, the embodiment may be easily implemented with very little additional cost in terms of design costs. Additionally, the embodiment requires very little additional space in an integrated circuit, thereby minimally impacting the overall cost of the oscillator.

Yet another advantage of an embodiment is that additional inductors can be added to the LC oscillator to provide a wide frequency tuning range. In other words, the embodiment may be combined with other techniques for increasing the LC oscillator's frequency tuning range. This may permit a further widening of the LC oscillator's frequency tuning range. For example, more than one inductor can be added to the LC oscillator and these added inductors can be switched in and out, either individually or in combination, to provide a wide frequency tuning range with potentially fine tuning adjustments.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2a and 2b are diagrams of top and isometric views of a multi-tap inductor;

FIG. 2c is a diagram of a simplified model of a multi-tap inductor;

FIG. 2d is a diagram of an isometric view of a multi-tap inductor in combination with a secondary inductor;

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a multi-standard cellular telephone that needs to operate in multiple frequency ranges. The invention may also be applied, however, to other electronic devices, such as communications devices including transmitters and receivers, that have a need to operate in multiple frequency ranges.

Figure 1:
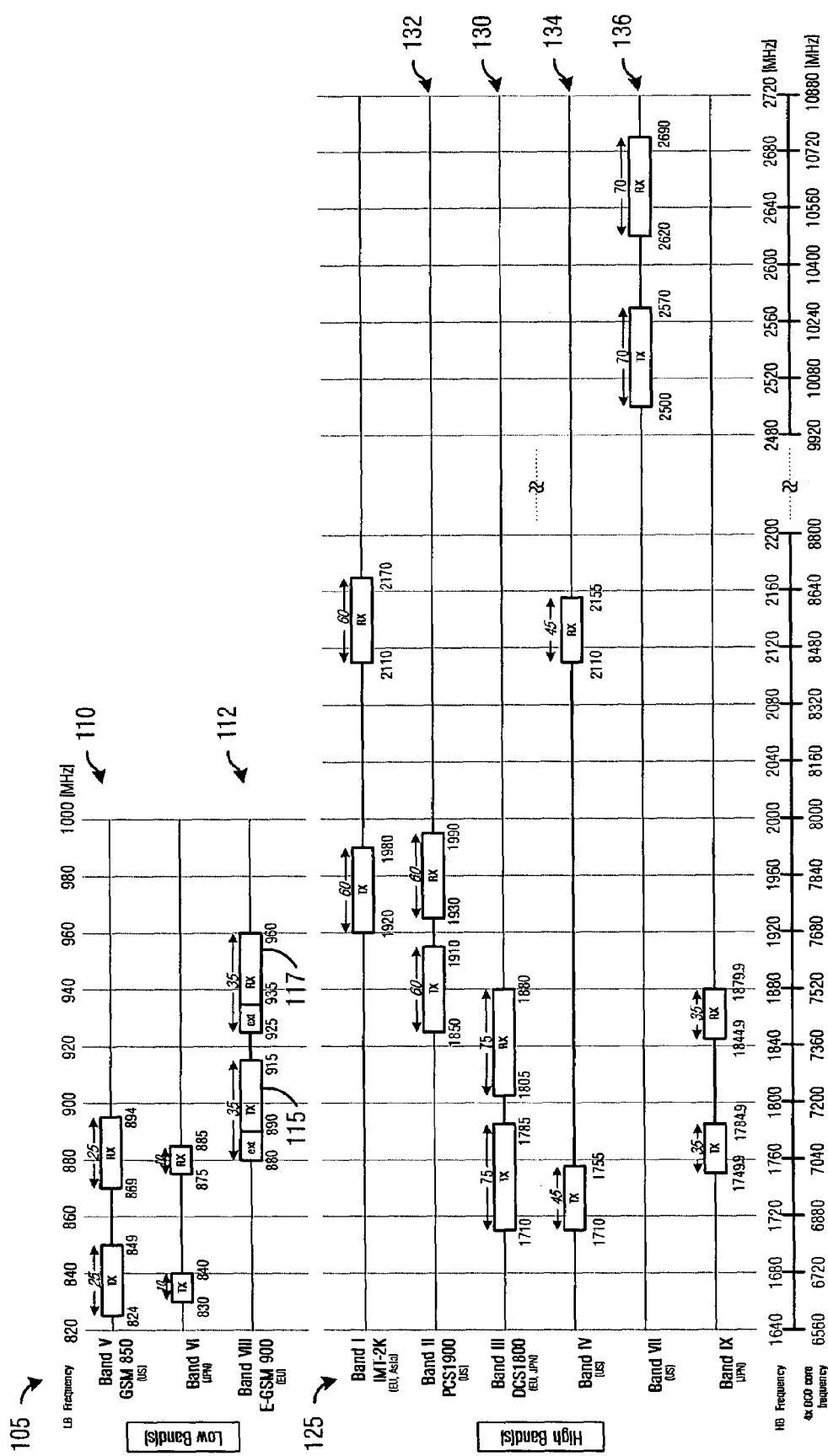
FIG. 1 is a diagram of frequency allocation for an exemplary cellular telephone.

With reference now to FIG. 1, there is shown a frequency diagram for an exemplary cellular telephone, wherein the cellular telephone is a multi-standard telephone. The frequency diagram shown in FIG. 1 illustrates various frequency ranges wherein the cellular telephone may be required to operate. As shown in FIG. 1, the frequency diagram illustrates the frequency ranges in use for a multi-standard cellular telephone that may be designed to be compatible with multiple GSM and WCDMA, specifically, Universal Mobile Telecommunications Services (UMTS), standards being used throughout the world. While the frequency diagram illustrates different UMTS bands, the use of specific frequency ranges and communications standards, namely, UMTS, should not be construed as being limiting to the spirit of the present invention. For example, the embodiment may be equally applicable to the various TDMA, CDMA, and FDMA communications standards in use throughout the world. Furthermore, the discussion of cellular telephones and cellular telephone communications standards should also not be construed as being limiting to the spirit of the embodiment to only cellular telephones. The embodiment may be applicable to other wired and wireless communications devices, such as tunable filters, wired local area networks (LANs), wireless LANs such as Wi-Fi, Global Positioning System (GPS), walkie-talkies, two-way radios, satellite telephones, optical communications devices, clock recovery circuits, wireless input devices (mouse, keyboard, etc.), wireless entertainment systems, and so forth.

The frequency diagram shows two frequency bands, a low band 105 (ranging from about 820 MHz to about 960 MHz) and a high band 125 (ranging from about 1.7 GHz to about 2.7 GHz). The low band 105 includes a GSM 850 band 110 and a GSM 900 band 112 while the high band 125 includes a Digital Cellular System (DCS) 1800 band 130 and a Personal Communications Service (PCS) 1900 band 132 as well as other bands, including Band IV 134, Band VII 136, and so forth. Some of the bands shown in FIG. 1 (band 110, band 130, band 132) and several additional bands (band 134 and band 136) comprise a four-band wideband-CDMA (WCDMA) standard. Furthermore, there are also a few newly emerging WCDMA frequency bands. Within each band, there may be two frequency ranges that the cellular telephone should be able to tune to, a transmit frequency range (TX) and a receive frequency range (RX). For example, in the GSM 900 band 112, a TX frequency range 115 spans a frequency range of about 880 MHz to about 915 MHz and a RX frequency range 117 spans a frequency range of about 925 MHz to about 960 MHz.

Due to the relatively wide frequency range of the low band 105 (about 136 MHz wide) which from 892 MHz center carrier frequency corresponds to more than 15% of the frequency tuning range) and the high band 125 (about 460 MHz wide) which from a 1940 MHz center carrier frequency corresponds to about 24% of the frequency tuning range, it may be difficult for a single LC oscillator to span the entire frequency range. This is also without considering the newly emerging band between 2500 and 2690 MHz. The difficulty may be due to constraints such as a low voltage supply, device characteristics of the varactor (limited $C_{max}/C_{min}$ ratio), parasitic capacitance of active and passive devices, additional parasitic capacitance due to dummy metal patterns in deep-submicron CMOS process technology, large oscillator signal swing decreasing an effective varactor $C_{max}/C_{min}$ ratio, and so forth. Difficulties in creating a single LC oscillator that is capable of tuning the entire range of both the low band 105 and the high band 125 are considered to be well understood by those of ordinary skill in the art of the present invention and will not be discussed further.

While the design of a single LC oscillator that is capable of tuning the entire range of a wide frequency range may be difficult, if not impossible, prior art techniques have proposed the creation of an LC oscillator that uses multiple oscillator cores and LC tanks. The use of multiple oscillator cores and LC tanks may extend the tuning range of the LC oscillator so that the entire frequency range may be covered. Unfortunately, the CMOS switch may be a source of significant parasitic capacitance, which may present a problem as the operating frequencies increase due to the relatively small total capacitance of the LC oscillator, thereby not being able to effectively increase the total frequency tuning range.

With reference now to FIGS. 2a and 2b, there are shown diagrams illustrating a schematic and an isometric view of a multi-tap inductor 200. FIG. 2a illustrates a schematic of seven-tap inductor. The multi-tap inductor 200 includes a center tap labeled "CT" and three pairs of taps. A first pair of taps labeled "1L" and "1R" represent a first left tap and a first right tap. The multi-tap inductor 200 also includes a second pair of taps labeled "2L" and "2R" and a third pair of taps labeled "3L" and "3R." Each pair of taps may be positioned at different locations along a conductor of the multi-tap inductor 200 and may create inductors of different inductance, depending upon which pair of taps is coupled to a circuit. For example, when coupled to the multi-tap inductor 200 using the first pair of taps, a first inductance may be realized, and when coupled to the multi-tap inductor 200 using a second pair of taps, a second inductance may be realized, and so forth.

As shown in FIG. 2a, the inductance of the multi-tap inductor 200 may be maximized when coupled to the multi-tap inductor 200 using the first pair of taps, and the inductance of the multi-tap inductor 200 decreases when a circuit is coupled to the multi-tap inductor 200 using the second pair of taps and the third pair of taps. Although shown in FIG. 2a as a seven-tap inductor, the multi-tap inductor may be extended to an arbitrary odd number of taps greater than three, for example, five, seven, nine, eleven, and so forth, and the illustration and discussion of a seven-tap inductor should not be construed as being limiting to either the scope or the spirit of the present invention.

When an inner pair of taps, such as the second pair of taps or the third pair of taps, are used to create an inductor with a lower inductance, the portion of the conductor of the multi-tap inductor 200 that lies to the outside of the taps being used may be left floating (hanging) and may not be contributing to the inductance of the multi-tap inductor 200 through magnetic coupling. Therefore, their presence may not degrade the Q (quality factor) of the multi-tap inductor 200. The presence of the floating conductors may contribute slightly to the parasitic capacitance, however.

The diagram shown in FIG. 2b illustrates an isometric view of the multi-tap inductor 200 as implemented in an integrated circuit. The multi-tap inductor 200 may be created from a single conductor 205. When a crossover of the inductor 205 may be needed, a first portion of the crossover of the inductor 205 (shown as portion 210) may be formed over a second portion of the crossover of the inductor 205 (shown as portion 215). The portion 215 may be electrically isolated from the portion 210 by an insulating layer, for example.

The diagram shown in FIG. 2c illustrates a simplified model 250 of the multi-tap inductor 200. The simplified model 250 comprises a linear representation of the conductor of the multi-tap inductor 200 with each of the three pairs of taps positioned at different locations along the conductor. As a separation between pairs of taps decreases, for example, between the first pair of taps "1L" and "1R" and the second pair of taps "2L" and "2R," the inductance of a resulting inductor may also decrease. The pairs of taps may be positioned at any point along the conductor. For example, the taps in a pair of taps may be positioned so that they are about equi-distant from the center tap "CT." Alternatively, the taps in a pair of taps may be positioned at locations that may make the multi-tap inductor 200 easier to fabricate (for routing purposes, for example).

The diagram shown in FIG. 2d illustrates an isometric view of a variable inductor 275. The variable inductor 275 includes a multi-tap inductor, such as the multi-tap inductor 200, and two secondary inductors, such as first secondary inductor 280 and a second secondary inductor 285. The multi-tap inductor 200 shown in FIG. 2d may be a seven-tap inductor, like the seven-tap inductor shown in FIG. 2a. The secondary inductors (the first secondary inductor 280 and the secondary inductor 285) may be switched on or off to alter the overall inductance of the variable inductor. Although shown to include two secondary inductors, the variable inductor 275 may have a larger or smaller number of secondary inductors, for example, one, three, four, and so on, with the number of secondary inductors potentially being determined by the desired frequency tuning range. A detailed description of the secondary inductors may be found in a co-assigned patent application, Publication Number US 2005/0184820, entitled "System and Method for Increasing Radio Frequency (RF)/Microwave Inductor-Capacitor (LC) Oscillator Frequency Tuning Range," published Aug. 25, 2005, which is incorporated herein by reference, now U.S. Pat No. 7,375,598, issued May 20, 2008.

Figure 3:
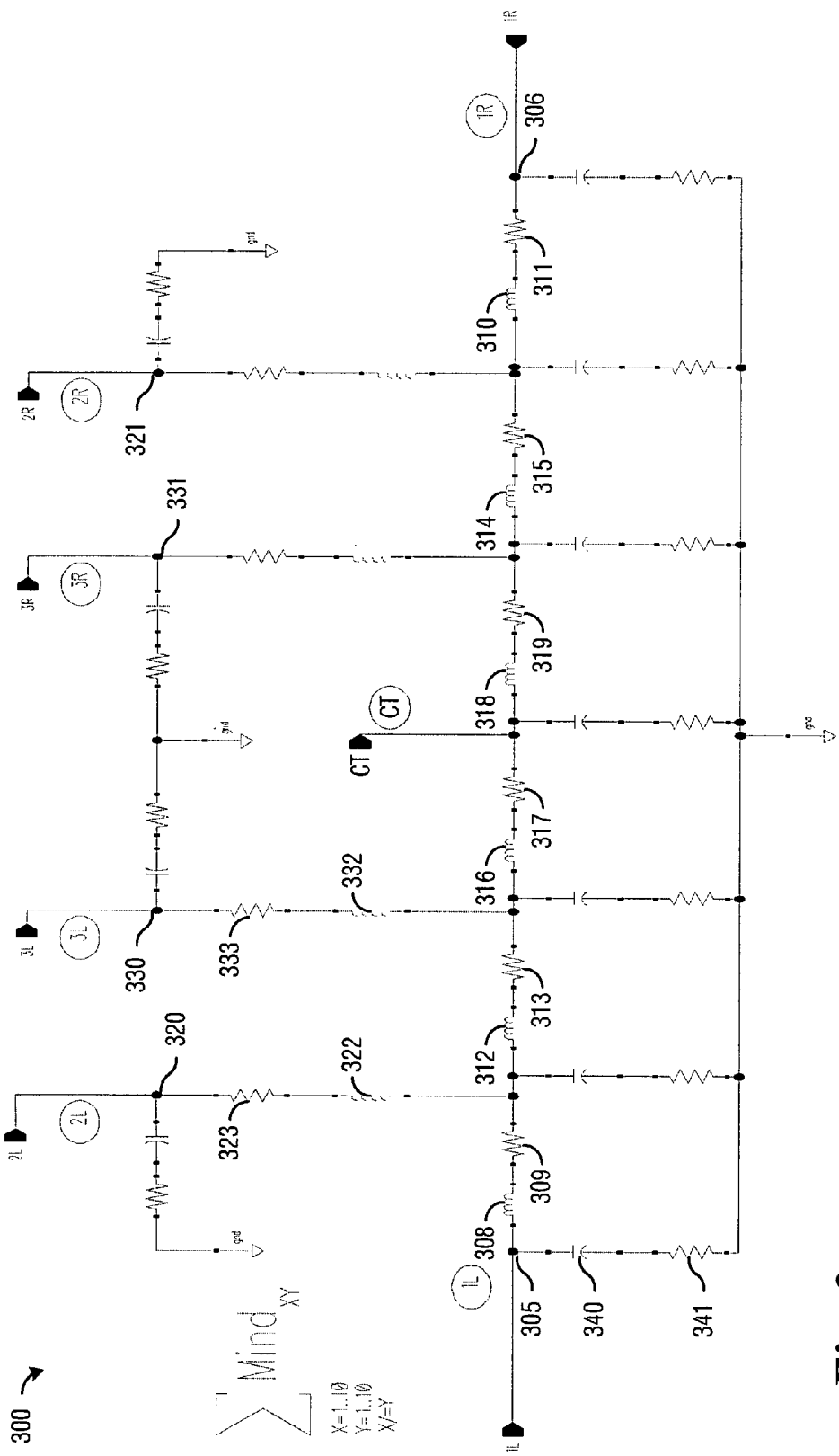
FIG. 3 is a diagram of an electrical model of a multi-tap inductor.

With reference now to FIG. 3, there is shown a diagram illustrating an electrical model 300 of a multi-tap inductor. The electrical model 300 is a model of a seven-tap inductor, such as the seven-tap inductor shown in FIGS. 2a and 2b. The electrical model 300 includes a first pair of taps, labeled "1L" at point 305 and "1R" at point 306. A sequence of inductors 308, 310, 312, 314, 316, and 318 and resistors 309, 311, 313, 315, 317, and 319 may be used to model the electrical properties of an inductor realized at the first pair of taps. The electrical model 300 also includes a second pair of taps, labeled "2L" at point 320 and "2R" at point 321, and a third pair of taps, labeled "3L" at point 330 and "3R" at point 331.

In an inductor realized at the second pair of taps, inductor 308 and resistor 309 may be disconnected, and inductor 322 and resistor 323 may be used to model the parasitic inductance and resistance of the tap interconnect. Similarly, inductor 310 and resistor 311 may be disconnected. Likewise, an inductor realized at the third pair of taps, inductors 308 and 312, and resistors 309 and 313 may be disconnected, and inductor 332 and resistor 333 may model the parasitic inductance and resistance of the tap interconnect. Similarly, inductors 310 and 314 and resistors 311 and 315 may be disconnected. Other resistors and capacitors, such as resistor 340 and capacitor 341, may model parasitic capacitance and resistive loss of various lengths of conductors of the multi-tap inductor being modeled.

Figure 4A:
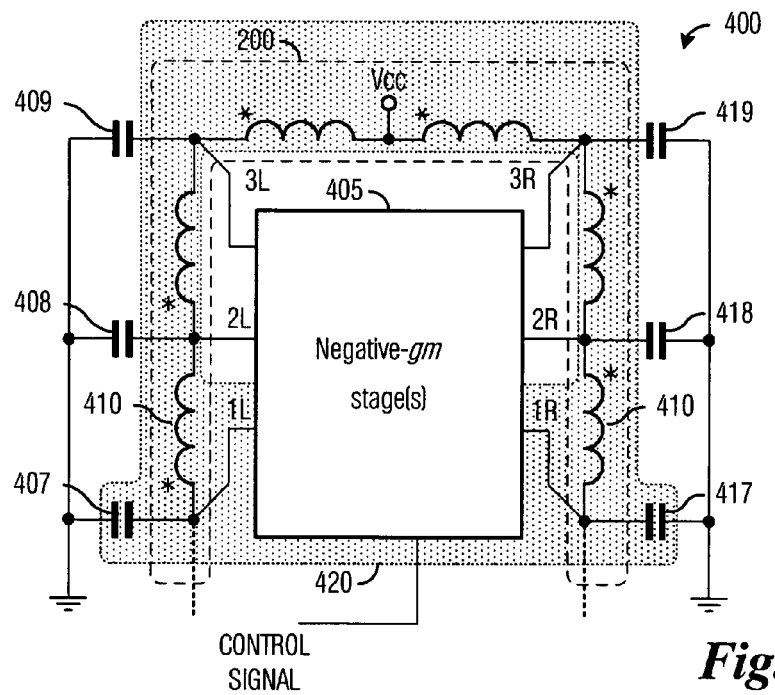
FIG. 4a is a diagram of a high-level view of a voltage controlled oscillator.

With reference now to FIG. 4a, there is shown a diagram illustrating a schematic of a multi-band voltage controlled oscillator (VCO) 400. The multi-band VCO 400 includes a multi-tap inductor 200, a plurality of negative-Gm stages 405, and capacitors 407, 417, 408, 418, 409 and 419. Not all capacitors shown are required to be present to form the multi-band VCO 400, and the capacitors 407 and 417 may be implemented differently from each other. The number of negative-Gm stages in the plurality of negative-Gm stages 405 is preferably equal to the number of pairs of taps in the multi-tap inductor 200. For example, if the multi-tap inductor 200 is a seven-tap inductor with three pairs of taps, then the plurality of negative-Gm stages 405 should have three negative-Gm stages. Any of the negative-Gm stages may be independently enabled. The negative-Gm stages in the plurality of negative-Gm stages 405 may be coupled in parallel to the multi-tap inductor 200, with one negative-Gm stage being coupled to each pair of taps. The plurality of negative-Gm stages 405 may be coupled to the taps of the multi-tap inductor 200, for example, at points labeled "1L," "1R," "2L," "2R," "3L," and "3R" in the diagram shown in FIG. 4.

A control signal "CONTROL SIGNAL" may be used to select a negative-Gm stage to be coupled to the multi-tap inductor. In an alternative embodiment, a separate control signal line may be coupled to each negative-Gm stage in the plurality of negative-Gm stages 405 and an active signal may be applied to a negative-Gm stage to be coupled to the multi-tap inductor 200.

The unused conductors of the multi-tap inductor 200 and the unused negative-Gm stages of the plurality of negative-Gm stages 405 do not contribute negatively to the operation of the multi-band VCO 400. For example, a negative-Gm stage coupled to the multi-tap inductor 200 at points labeled "2L" and "2R" may be enabled with the remaining negative-Gm stages in the plurality of negative-Gm stages 405 may be disabled, then (depending on the configuration of the multi-tap inductor 200) the effective tank inductance may be reduced compared to a situation when a negative-Gm staged coupled to the multi-tap inductor 200 at points labeled "1L" and "1R" is enabled with remaining negative-Gm stages disabled. However, the conductor segments between points "1L" and "2L" and points "1R" and "2R" (shown in FIG. 4 as inductive elements 410) may be floating and may not contribute inductance through magnetic coupling, therefore not negatively impacting the Q of the multi-tap inductor 200.

It may also be possible to couple some of the negative-Gm stages of the plurality of negative-Gm stages 405 so that they may produce additional current with either the same polarity or the negative polarity as the other negative-Gm stages, thereby decreasing or increasing the effective inductance seen by the multi-band VCO 400. This may help to further increase a total frequency tuning range of the multi-band VCO 400.

A combination of the negative-Gm stage coupled to a pair of taps of the multi-tap inductor 200 and a capacitor form an LC tank, which may then be used in the multi-band VCO 400 to produce a desired frequency. For example, the capacitor 407, a corresponding capacitor 419, a negative-Gm stage, and an inductor created with the negative-Gm stage coupled to points labeled "1L" and "1R" may create an LC tank 420.

Figure 4B:
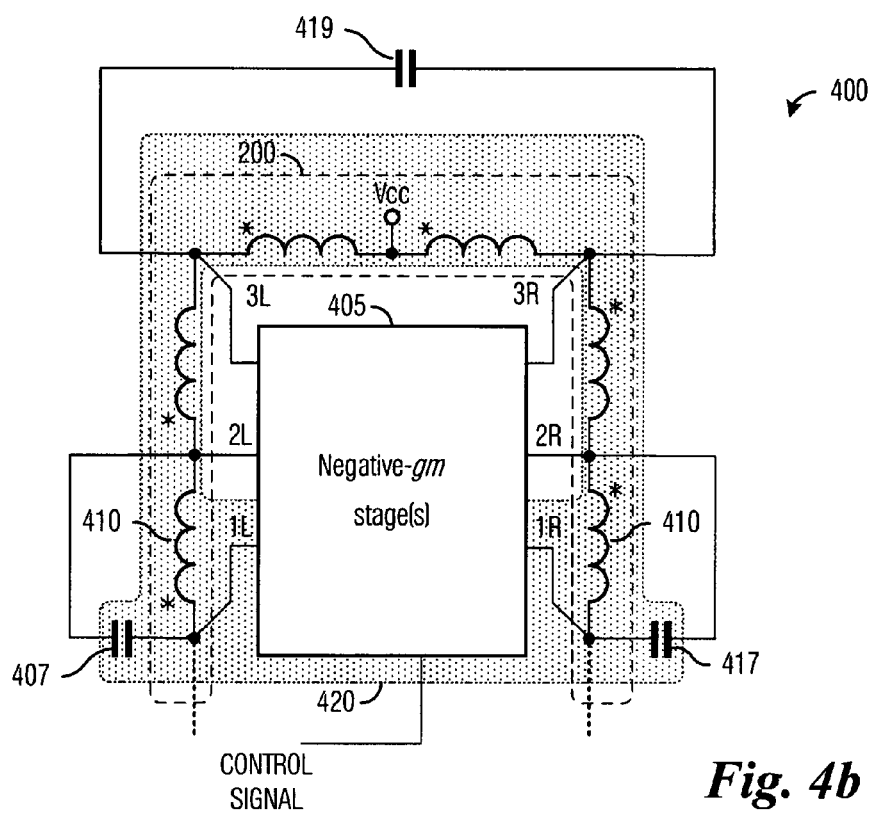
FIG. 4b is a diagram of a portion of an alternate embodiment of a voltage controlled oscillator.

FIG. 4b illustrates an alternative embodiment of the multi-band VCO 400, wherein capacitors, such as capacitor 407, capacitor 417, and capacitor 419, may be coupled between the taps. For example, the capacitor 407 may be coupled between the tap "1L" and the tap "2L," while the capacitor 417 may be coupled between the tap "1R" and the tap "2R" rather than a tap and an electrical ground as are capacitors shown in FIG. 4a. The capacitor 419 may span the center tap and may be coupled between the tap "3L" and the tap "3R." A multi-band VCO may include capacitors arranged as shown in FIG. 4a or FIG. 4b or a combination of both.

Figure 5:
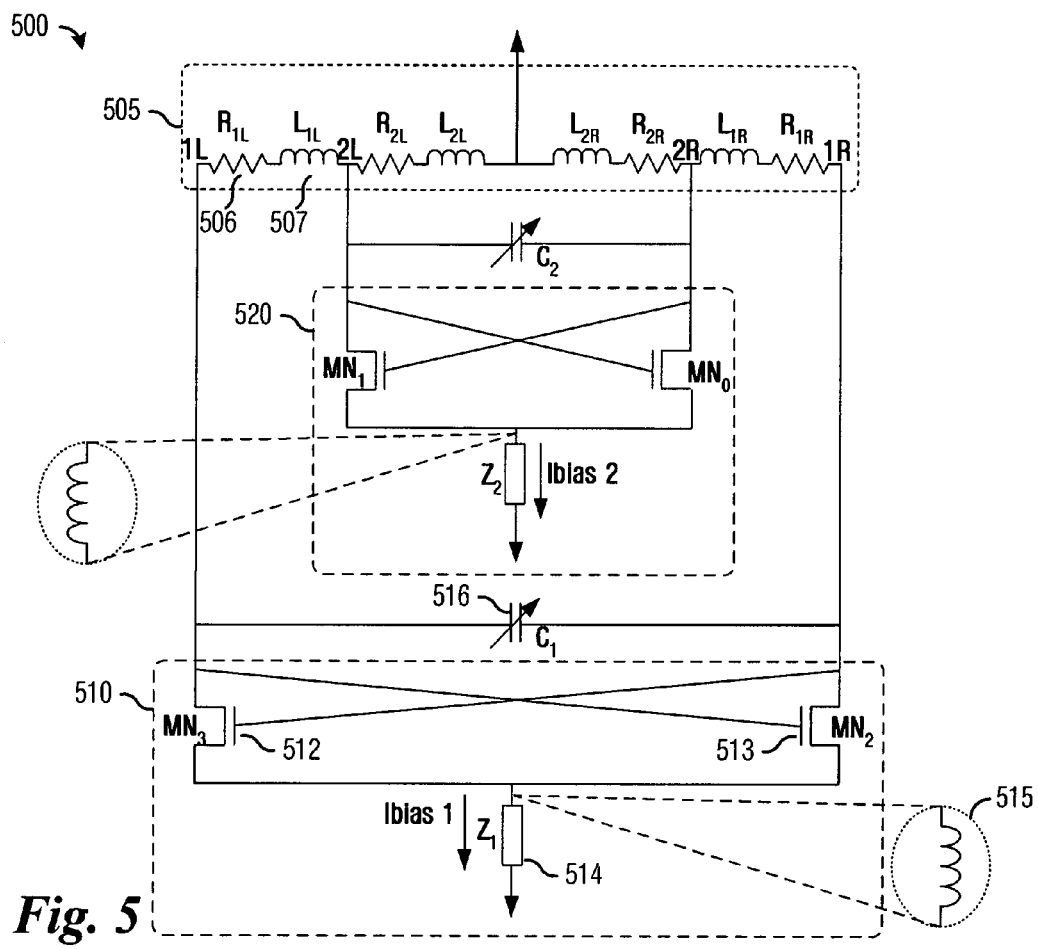
FIG. 5 is a diagram of an exemplary embodiment of a voltage controlled oscillator.

With reference now to FIG. 5, there is shown a diagram illustrating a schematic of a multi-band VCO 500. The multi-band VCO 500 shown in FIG. 5 includes a five-tap inductor 505, a first negative-Gm stage 510, and a second negative-Gm stage 520. The five-tap inductor 505 is shown as a simplified electrical model formed with resistors, such as resistor 506, and inductors, such as inductor 507, representing the resistance and inductance of a conductor of the five-tap inductor 505. Although the diagram illustrates a five-tap inductor 505, the multi-band VCO 500 may utilize a multi-tap inductor with a larger number of taps if the frequency tuning range of the multi-band VCO 500 requires a multi-tap inductor with a larger number of taps. Therefore, the discussion of a five-tap inductor should not be construed as being limiting to either the scope or the spirit of the present invention.

The first negative-Gm stage 510 may be coupled to the two-tap inductor 505 at points labeled "1L" and "1R." The first negative-Gm stage 510 includes a pair of transistors, transistors 512 and 513, preferably NMOS transistors with cross-coupled gate terminals. The pair of transistors with cross-coupled gate terminals is a standard negative-Gm configuration. Coupled to the first negative-Gm stage 510 may be a bias circuit 514, with the bias circuit 514 providing a voltage drop for a bias current "ibias 1," creating the negative-Gm of the first negative-Gm stage 510. Optionally, an inductor 515 may be inserted between the pair of transistors and the bias circuit 514. The inductor 515 may help to improve phase noise performance.

A variable capacitor 516 permitting a tuning of a LC tank created by the first negative-Gm stage 510. The second negative-Gm stage 520 may be similarly configured. Although shown to be NMOS transistors, the transistors in the negative-Gm stage may also be PMOS, bipolar junction transistors, MESFET or any type of active device. The bias circuit 514 may be implemented as a resistor, an active resistor component, a transistor or any type of device creating a current control capability, such as a MOSFET transistor, a bipolar junction transistor, a MESFET transistor, or so forth. The bias circuit 514 may also be replaced by a current source. The capacitor 516 may be formed by a dedicated capacitor or by the parasitic capacitors of the inductors, interconnect and transistors that could also be tuned by the body bias of the transistors.

Figures 6, 7:
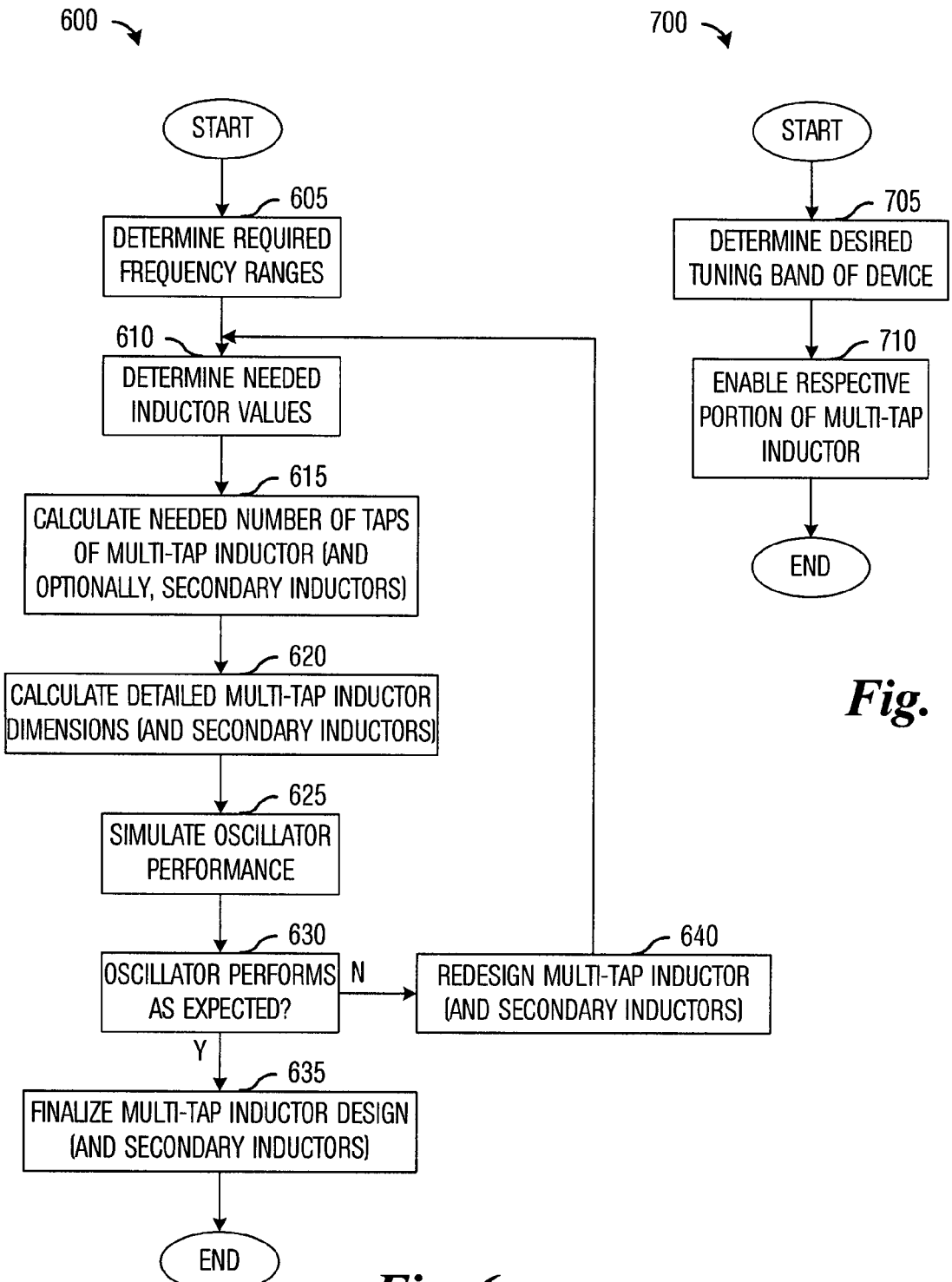
FIG. 6 is a diagram of an algorithm for designing a multi-tap inductor.
FIG. 7 is a diagram of an algorithm for operating a voltage controlled oscillator.

With reference now to FIG. 6, there is shown a diagram illustrating a sequence of events 600 in the design of an inductor for use in a multi-band VCO. The sequence of events 600 illustrates an exemplary design for an inductor that may be used in a multi-band VCO with an extended frequency tuning range. The design of the inductor may begin with a determination of required frequency ranges (block 605). For example, the required frequency ranges may be dependent upon the various frequency bands of a wireless device containing the multi-band VCO. A wireless device that may be capable of utilizing the different frequency bands shown in FIG. 1 may need to have a multi-band VCO capable of tuning frequency range of about 126 MHz and 460 MHz for the low band and the high band, respectively. Then, based on the required frequency ranges, a number of different inductor values that may be needed to allow the multi-band VCO to have the desired frequency tuning range will be determined (block 610). Also in block 610, a determination of tradeoffs between various inductor values and other circuit parameters may be performed.

From the different inductor values, the number of taps of a multi-tap inductor may be calculated (block 615). At this point, it may be possible to combine the multi-tap inductor with one or more secondary inductors, as described in FIG. 2d, to further increase the range of inductances of the multi-tap inductor. It may now be possible to calculate the dimensions of the multi-tap inductor along with any secondary inductors (block 620). A simulation of the performance of the multi-tap inductor may then be performed (block 625) to verify the performance of the multi-tap inductor and the multi-band VCO. If secondary inductors are a part of the design, they may be included in the simulation study as well.

If the multi-band VCO performs as desired (block 630), then the design of the multi-tap inductor may be finalized (block 635). If the multi-tap inductor also includes secondary inductors, their design may be finalized as well. If the multi-band VCO does not perform as desired (block 630), then it may be necessary to redesign the multi-tap inductor (and the secondary inductors, if any) (block 640). The redesign may be accomplished by repeating the calculation of the inductor values as well as determining the tradeoffs between inductor values and other circuit parameters (block 610), calculation of the number of taps of the multi-tap inductor needed (block 615) and then repeating the calculation of the dimensions of the multi-tap inductor (block 620), the simulation of the performance of the multi-band VCO (block 625), and so forth.

With reference now to FIG. 7, there is shown a diagram illustrating an algorithm 700 for operating a multi-band VCO. The algorithm 700 may execute in a wireless device during an initial power-on sequence or whenever there is a need to change operating frequency bands, such as when a user selects an alternate operating frequency band or when the wireless device moves outside of a communication networks operating range. The operation may begin with determining a desired tuning band (block 705). This may be determined by sequencing through a list of possible tuning bands or by searching for a tuning band from user input. Alternatively, the desired tuning band may be specified by a message or transmission from a wireless communication base station through the communication protocols. Using the desired tuning band information, which may contain information about a necessary configuration of the multi-tap inductor and associated LC tanks required to configure the multi-band VCO to tune to the desired tuning band, the wireless device may enable a specified negative-Gm stage while disabling unspecified negative-Gm stages in the multi-band VCO to enable the multi-band VCO to tune to the desired tuning band (block 710).

Figure 8:
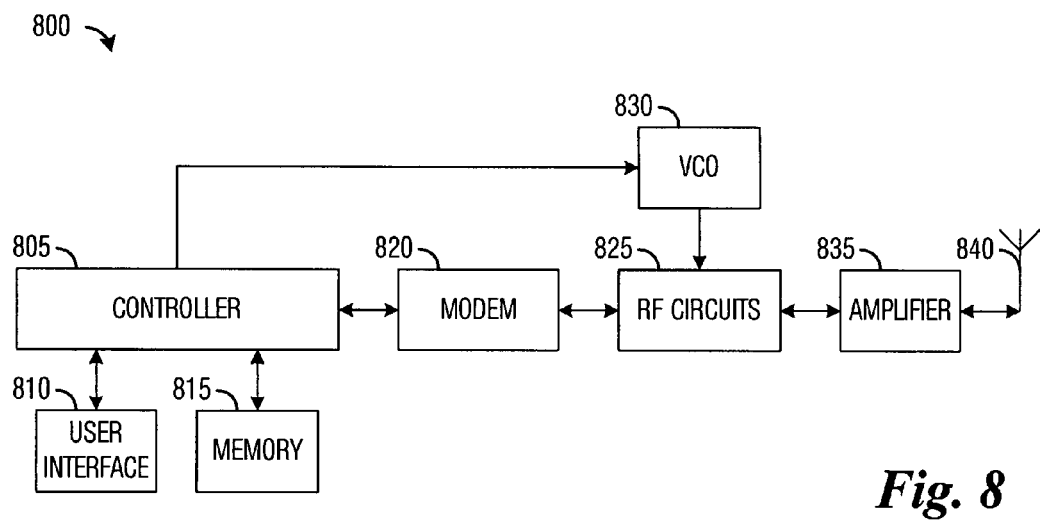
FIG. 8 is a diagram of an exemplary wireless communications device.

With reference now to FIG. 8, there is shown a diagram illustrating an exemplary wireless communications device 800. The wireless communications device 800 may be a cellular telephone or it may be a multi-function device that may include a cellular telephone, a pager, a computer, and so forth. The wireless communications device 800 may include a controller 805. The controller 805 may be implemented using a microprocessor, a general purpose processing unit, a custom designed integrated circuit, or so on. The controller 805 may be used to provide necessary processing and computing power needed by the wireless communications device 800 and its user. Additionally, the controller 805 may be used to execute programs and applications, control the operation of the wireless communications device 800, and so forth.

The wireless communications device 800 may also include a user interface (UI) unit 810, which may be responsible for interfacing the wireless communications device 800 and its user. For example, the UI unit 810 may render a graphical user interface, accept user input via a keypad, touch sensitive screen, or so forth, as well as play music, videos, and so forth. A memory 815 may be used to store programs, applications, and data, as well as provide a scratch area for the intermediate storage of computations performed by the controller 805.

To communicate wirelessly, the wireless communications device 800 may include a modem 820, a radio frequency (RF) unit 825, a voltage controlled oscillator (VCO) 830, an amplifier unit 835, and an antenna 840. The modem 820 may be responsible for modulating (encoding) and demodulating (decoding) data based on a communications standard so that the wireless communications device may communicate with other devices. For example, the modem 820 may modulate data created by the controller 805 so that the data may be transmitted to another communications device. The modem 820 may add error correction and/or error detection information to the data. The RF unit 825 may take modulated data from the modem 820 and perform signal processing on the modulated data to prepare it for transmission, such as converting the modulated data into an analog signal, mixing the analog signal to an appropriate frequency, and so forth.

Frequency and timing information used by the RF unit 825 may be provided by the VCO 830. When the wireless communications device 800 is capable of operating in a wide range of frequencies, the VCO 830 must be able to provide frequency and timing information appropriate for each of the range of frequencies. The VCO 830 may be coupled to the controller 805 and may receive control instructions and information from the controller 805. For example, the VCO 830 may be told to produce frequency and timing information based on control instructions and information from the controller 805. The VCO 830 may make use of a multi-tap inductor to enable a wide tuning frequency range and may be implemented as shown in FIG. 4 or FIG. 5. The VCO 830 may also include one or more secondary inductors to help further increase the tuning frequency range.

The amplifier 830 may be used to increase the signal level of the processed and modulated data so that it may be possible to transmit the data over-the-air by the antenna 840. A similar, but reversed set of operations may be utilized for data received by the wireless communications device 800. If the wireless communications device 800 is designed for one-way communications, such as a receive-only or transmit-only wireless communications device, some of the components of shown in FIG. 8 may have reduced complexity and functionality.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An oscillator with extended frequency tuning range, the oscillator comprising a plurality of inductor-capacitor (LC) tanks, the plurality of LC tanks comprising:
   A. a multi-tap inductor having at least two pairs of taps and a center tap, wherein each pair of taps is coupled to a conductor at specified positions on the conductor, wherein the center tap is coupled to a first power rail;
   B. a plurality of capacitors, each capacitor having a first terminal coupled to a tap of the pairs of taps of the multi-tap inductor;
   C. a plurality of negative-Gm stages, each negative-Gm stage controllably coupled to a pair of taps of the multi-tap; and
   D. each capacitor in the plurality of capacitors has a second terminal coupled to a voltage reference, and wherein the voltage reference comprises a second power rail, an AC ground, or a virtual ground.

2. The oscillator of claim 1, wherein the two taps from each pair of taps are positioned on opposite sides of the center tap.

3. The oscillator of claim 1, wherein at least one of the negative-Gm stage comprises a pair of transistors, each transistor having a first terminal coupled to a tap of a pair of taps of the multi-tap inductor, a second terminal coupled to a bias circuit, and a control terminal cross-coupled to the first terminal of the other transistor in the pair of transistors.

4. The oscillator of claim 3, wherein the transistors in the pair of transistors are selected from the group consisting of: NMOS transistors, PMOS transistors, bipolar junction transistors.

5. The oscillator of claim 3, wherein the bias circuit is selected from the group consisting of: MOSFET transistors, bipolar junction transistors, MESFET transistors.

6. The oscillator of claim 3, further comprising an inductor coupled between the pair of transistors and the bias circuit.

7. An electronic communications device comprising:
- a controller configured to regulate the operation of the electronic communications device and to perform computations;
- a modem coupled to the controller, the modem configured to modulate data to be transmitted by the electronic communications device;
- a radio frequency unit coupled to the controller and to the modem, the radio frequency unit configured to convert a digital data stream into an analog signal and to mix the analog signal with a carrier signal;
- an oscillator coupled to the controller and to the radio frequency unit, the oscillator configured to produce a timing and frequency reference signal for the radio frequency unit based on control information provided by the controller, the oscillator comprising,
  - a multi-tap inductor having at least two pairs of taps and a center tap, wherein each pair of taps is coupled to a conductor at specified positions on the conductor, wherein the center tap is coupled to a first power rail,
  - a plurality of capacitors, each capacitor having a first terminal coupled to a tap of the pairs of taps of the multi-tap inductor and a second terminal coupled to a second power rail, and
  - a plurality of negative-Gm stages, each negative-Gm stage controllably coupled by the controller to a pair of taps of the multi-tap inductor;
- an amplifier coupled to the radio frequency unit, the amplifier configured to increase a signal level of a mixed analog signal to a level for transmission by an antenna;
- a memory coupled to the controller, the memory to store programs and data; and
- a user interface unit coupled to the controller, the user interface unit configured to accept user input.

8. The electronic communications device of claim 7, wherein the control information provided by the controller couples a negative-Gm stage from the plurality of negative-Gm stages to the multi-tap inductor.

9. The electronic communications device of claim 7, wherein the timing and frequency reference signal produced by the oscillator is based on a desired tuning frequency.

* * * * *